United States Patent Office 3,392,061

Patented July 9, 1968

3,392,061

THERMOELECTRIC MOSAIC INTERCONNECTED BY SEMICONDUCTOR LEG PROTRUSIONS AND METAL COATING

Horst Schreiner, Nurnberg, and Fritz Wendler, Erlangen, Germany, assignors to Siemens Aktiengesellschaft, a corporation of Germany Filed Sept. 17, 1962, Ser. No. 223,973

Claims priority, application Germany, Sept. 19, 1961, S 75,813

6 Claims. (Cl. 136—203)

Our invention relates to thermoelectric devices for cooling, heating or current-generating purposes in which the legs of a multiplicity of thermocouples are arranged in a mosaic pattern but mutually spaced relation and are firmly cemented or otherwise joined together to form a single layer or block whose respective top and bottom surfaces are substantially coincident with respective two end faces of each leg, the mechanical bond between the legs consisting of an insulating organic or inorganic cement of low thermal conductivity or of an insulating casting resin or the like bonding material. Such multi-couple, single-block thermoelectric devices are described, for example, in the copending applications of W. Hänlein, Ser. No. 150,701, filed Nov. 7, 1961, and now abandoned, and H. G. Traeger, Ser. No. 192,254, filed May 3, 1962, and now abandoned, both assigned to the assignee of the present invention.

The assembling and joining of the thermocouple legs, produced by melting or sintering, to form such a thermoelectric device has heretofore been effected by a rather complicated and time-consuming method, involving the necessity of first coating the contact faces of the individual legs with contact material. This was done, for example, by coating the individual leg faces with bismuth, in some cases with simultaneous application of ultrasonics, or by electrolytically plating the individual faces with nickel, and thereafter soldering electrically good conducting bridge members upon and across the coatings of each two adjacent ones of the thermocouple legs. The two legs of each couple, of course, have respectively different thermoforces and preferably consist of semiconductor material, such as a mix-crystal of bismuth-telluride and bismuth-selenide having p-type conductance in one leg and n-type conductance in the other leg of each couple. Heretofore the fabrication of such p-type and n-type legs, produced by melting or sintering, required the application of conducting varnish coatings prior to the galvanic (electrolytic) precipitation of bridging contacts. Such electrolytic precipitation may then result in wavy boundary faces apt to subsequently impair the thermal contact on the cold and hot sides of the block structure.

It is an object of our invention to provide a thermoelectric device generally of the above-mentioned type which affords considerable savings in economical respect as regards the interconnection of the thermocouple legs within the multi-couple layer or block structure, thus reducing the amount of work and time required for the production of an entire device.

Another object, conjoint with the one just mentioned, is to eliminate or greatly minimize the danger of faulty connecting bridges apt to affect the properties of the completed thermoelectric device.

To achieve these objects and in accordance with our invention, the individual thermocouple legs of a block-type device are given such a shape that a contact bridge between each two adjacent legs in the layer or block is directly established only by joining the two legs together. More specifically, we provide one or both of each adjacent legs with a bridge portion that is integral with the main body of the leg and extends laterally away therefrom so as to contact the adjacent leg, with the result that the totality of integral bridge portions in the composite layer or block structure form an electric series connection of all legs.

The interconnections within the layer structure can then be strengthened and thickened by depositing conductive coatings insulated from one another on the two interconnected leg faces, each of these coatings covering contiguously one of the respective bridge portions as well as the end faces of the two legs interconnected by that bridge portion. The reinforcing coating can be produced by vapor deposition and/or electrolytic deposition and/or spraying the conducting coating material upon the surface areas to be coated, or also by cementing metal foils upon these surfaces. That is, one or more of the mentioned coating methods may be employed for producing a single reinforcing coating.

The protruding bridge portion has preferably the shape of a ledge which protrudes from the main body of the leg at and along one of the end faces of the leg while being spaced from the opposite end face of the same leg. According to another, preferred feature, the leg of at least one conductance type is given a recess along its end-face edge that extends along, and is engaged by, a protruding ledge portion of the adjacent leg of the other conductance type. The recesses and the corresponding ledge-like bridge portions can be given swallow-tail shape.

According to still another feature of our invention, the insertion of the cementing medium between the interspaces is facilitated and the insulating spacing is improved by giving at least the legs of the one conductance type a bevelled shape so as to form a funnel-shaped inlet opening for the interspace between the adjacent legs.

The legs, provided in the above-described manner with protruding bridge portions or ledges as well as with recesses and/or bevelled edges, can be produced in finished shape by pressing and sintering. However, they can also be produced by melting and can be given final shape by machining.

The above-mentioned and more specific objects, advantages and features of our invention, said features being set forth with particularity in the claims annexed hereto, will be apparent from, and will be described in, the following with reference to embodiments of thermoelectric devices according to the invention illustrated by way of example on the accompanying drawings in which:

Figures 1, 2, 3, 4, 5, 6, 7, 8, 9, 10, 11, 12, 13:
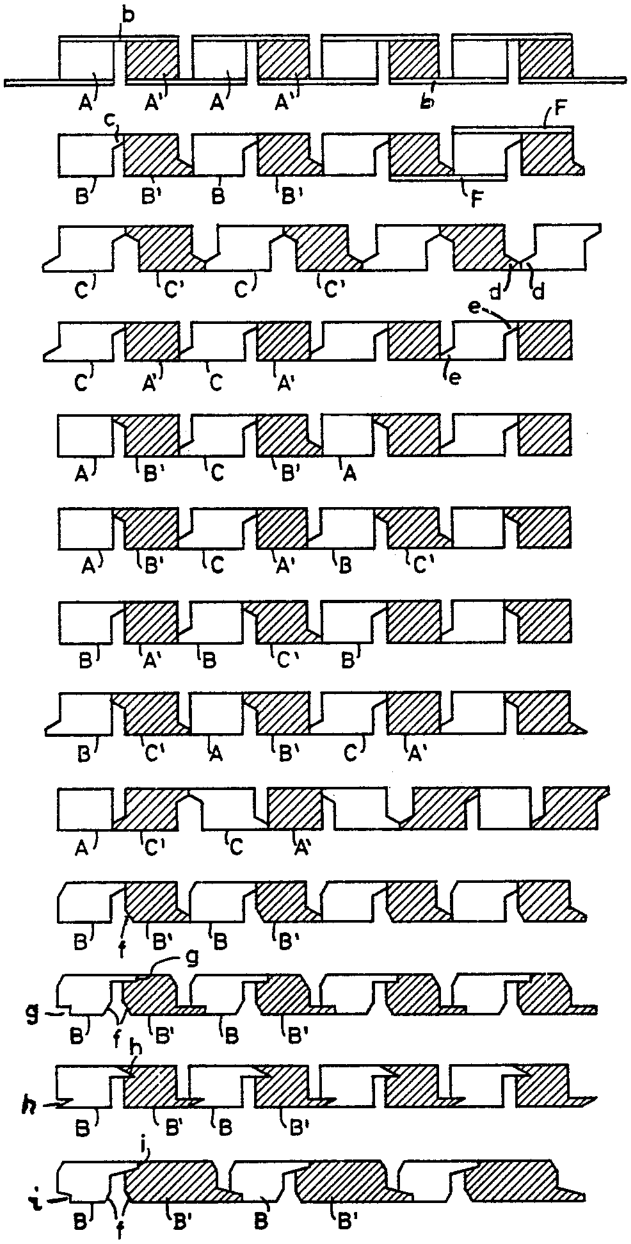
FIG. 1 PRIOR ART, FIG. 2, FIG. 3, FIG. 4, FIG. 5, FIG. 6, FIG. 7, FIG. 8, FIG. 9, FIG. 10, FIG. 11, FIG. 12, FIG. 13
FIG. 1 is explanatory and shows schematically a series arrangement of thermocouple legs in a layer arrangement according to the prior methods introductorily described in this specification.
FIGS. 2 through 13 illustrate twelve different thermoelectric layer-type devices designed and made in accordance with the invention.

According to FIG. 1, referring to a themoelectric battery device of prior design and manufacture, the layer or block is composed of thermocouples each having two legs A and A′ of prismatic shape consisting of thermoelectrically different materials. For example, the legs A have p-type conductance, and the legs A′, identified by diagonal hatching, have n-type conductance, both consisting otherwise of substantially the same semiconductor material such as the mix-crystal composition mentioned above. The legs are all spaced from each other and rigidly cemented together by insulating cement (not shown). Each two adjacent legs A, A′ are electrically interconnected by respective contact bridges *b* which are located on the top and bottom surfaces of the block. All hot junctions are located at the same surface, for example the top surface, and all cold junctions are at the other surface of the block. The device, like those according to the invention described below, is applicable for thermoelectric heating or cooling purposes. For example, when employing the device for cooling, respective cooling vanes or other heat exchange means may be conductively joined with the connecting bridges *b* located on the cold-junction surface. It will be noted that in the prior device according to FIG. 1, all legs A and A′ have a straight rectangular cross section in the plane of illustration.

In contrast thereto, some or all of the thermocouple legs in the device according to the invention as shown in FIGS. 2 to 13 are provided with lateral ledge-like projections that protrude toward an adjacent leg in order to directly form a connecting contact bridge. In FIGS. 2 through 13, the thermocouple legs that have a straight rectangular cross section are again denoted by A and A′, the difference in type of conductance or thermoforce being represented schematically by the fact that the legs A′ are diagonally hatched. The legs denoted by B and B′ are provided with a single ledge-like projection that protrudes from the rectangular main body portion of the leg toward the adjacent leg. The legs B are assumed to have p-type conductance for example, whereas the legs B′, also provided with a single protruding bridge portion and identified by diagonal hatching, are assumed to have n-type conductance for example.

Denoted by C (p-type) and C′ (n-type) are legs which are each provided with two integral ledge-like projections that protrude laterally toward opposite sides along the top surface and bottom surface respectively of the block assembly.

As explained above, the conventional design of thermoelectric battery blocks according to FIG. 1 requires soldering the connecting bridges *b* to the legs A and A′ which for this purpose must be prepared by conductively coating their end faces.

In contrast thereto, the device according to FIG. 2 is characterized by a simplified production in accordance with the invention. The thermoelectrically different legs of each pair or couple have the same size and the same shape, thus securing the same economy as in the case of the FIG. 1 device with respect to the molds or dies required for the production of these legs. The thermocouple legs according to FIG. 2, however, are electrically and thermally interconnected without the aid of additional bridges. It will be understood, however, that, if desired, the sizes and shapes of the two types of legs may also be different from each other, as is exemplified by FIGS. 4 and 13. In the embodiment of FIG. 3 each of the n-type and p-type legs is provided with two projecting ledges *d* that form contacting bridges. Each connecting bridge between adjacent legs C and C′ is thus formed by two bridge portions contacting each other.

In the embodiment of FIG. 4, one type of leg denoted by C and having, for example, p-type conductance, is provided with two protruding bridge portions *e*, whereas the other legs A′ of n-type conductance have straight rectangular shape without any protruding contact portions.

The various other modifications shown in FIGS. 5 to 13 require no additional explanation. However, it will be noted that in the embodiment of FIGS. 10, 11 and 13, the interstitial slots between each two legs are widened at the opening located at the block surface remote from the connecting bridge portion in the respective slots. The widening is effected by giving the corresponding edge of one or both adjacent legs a bevelled shape *f* at the proper edges. The funnel-shaped opening thus produced for each interspace facilities filling the insulating and cementing material between the legs and also increases the effective insulation or creep distance between the legs at the block surface. These widened openings are also of advantage in better preventing those spaces that are to remain insulated from becoming inadvertently closed or conductively bridged. Furthermore, the legs according to FIGS. 12, 12 and 13 are provided with recesses *g, h, i,* for receiving the correspondingly shaped ends of the connecting bridge portions. In the embodiment of FIG. 12, the recesses *h* and the corresponding ends of the bridge portions have swallow-tail shape.

Figure 14:
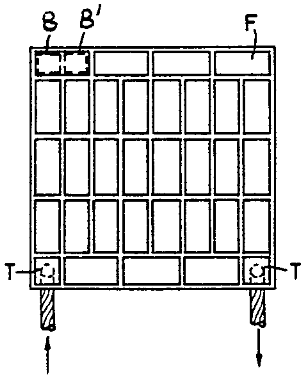
FIG. 14 is a bottom view of a completed thermoelectric device according to the invention in form of a layer or plate.
Figure 15:
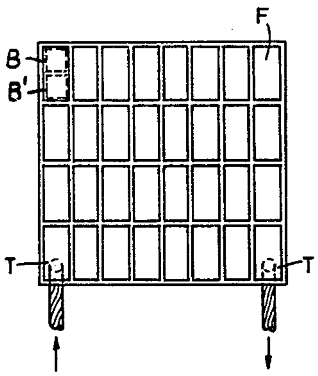
FIG. 15 is a top view of the same device.
Figure 16:
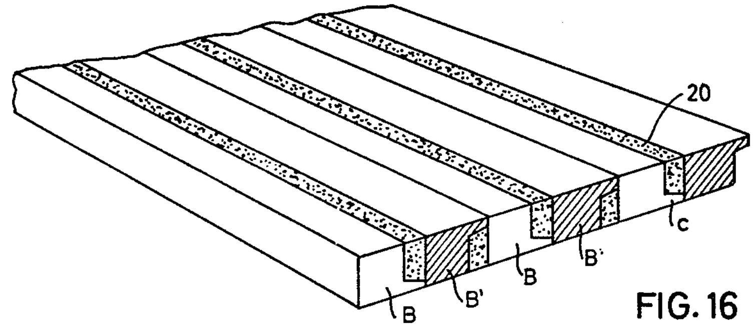
FIG. 16 shows in perspective a device according to FIGS. 2, 14 and 15 during an intermediate stage of manufacture.

A preferred method of producing a device according to the invention will be described presently with reference to FIG. 16. Rods of thermoelectric materials having cross sections corresponding to FIG. 2 are arranged in a single layer so that p-type rods B and n-type rods B′ alternate with each other. The rods are in contact with each other along the ends of the bridge portions *c*. They are cemented together by means of an insulating cement 20 so as to form a flat, planar body. This body is thereafter cut into strips extending in directions perpendicular to the longitudinal direction of the rods B, B′. Thereafter several such strips, each comprising a series of thermocouple legs, are cemented together by insulating material to form a mosaic block as shown in FIGS. 14 and 15. However, it should be taken into account that FIGS. 14 and 15 illustrate the block in finished condition, that is, after each two end faces of adjacent elements are contacted by metal strips F (FIGS. 2, 14, 15) in the same manner as heretofore employed for such devices and as mentioned in the above-cited copending applications. This method, affording a considerable simplification in the production of thermocouple blocks, can be carried out in the following manner.

The electrically good conducting connection afforded by the bridge portions of the thermocouple legs in a device according to the invention, is first metallically thickened by the known expedients, for example by vapor deposition electrolytic deposition, spray deposition and/or cementing of metallic foils onto the end faces of each two adjacent legs, some of these being denoted by F in FIGS. 14, 15. These metallic coatings on the end faces of the legs, each coating extending over two such adjacent end faces, including the area of the interconnecting bridge *c*, are preferably made of copper or another electrically good conducting metal or metal alloy. It has been found that a thickness of the coatings between 100 and 500 microns is sufficient. If the reinforcing coating of the connections is to be produced by vapor deposition of metal, it is preferable to place a mask upon the surface of the layer, having openings at those locations where two adjacent element end faces are to be given a coating. Then a metal, such as nickel, iron or molybdenum is vapor-deposited in a layer thickness of 1 to 5 microns. Thereafter a second metal such as copper, silver or aluminum is vapor deposited in a thickness of up to 500 microns. These vapor deposition processes can be effected in a continuously operating equipment in directly succesive steps, namely, by vaporizing onto the exposed surfaces the respective metals from two separate vaporizers, and the layer blocks or plates can be sluiced into and out of the processing equipment so that a continuous performance is secured. If aluminum coatings are used, they are preferably subjected to subsequent oxidation to produce an electrically non-conducting thin oxide layer which affords an excellent heat contact.

If the above-mentioned coatings F are electrolytically precipitated, the legs are first embedded in insulating synthetic casting resin. The surfaces of the resulting plate are then cleaned, prior to electrolytic precipitation, with the aid of solvents, acids, or lyes, or also electrochemically by means of electrolytic baths, or by mechanical cleaning methods of which we prefer to use grinding on wet corundum linen. In order to improve the electric conductance of the mutually contacting legs, a thin coating of conducting varnish can be placed upon the contacting zones. The electrolytic precipitation of a nickel coating upon the semiconducting legs is preferably effected from acidic baths. The nickel coating coalesces well with the rough surface of the semiconductor material and fills any superficial voids. The layer thickness of the nickel may amount to 3 to 5 microns. Thereafter, a copper layer can be precipitated upon the nickel layer from an acidic copper bath in a thickness up to 500 microns. During this operation, it is advisable to have the plate-shaped block surrounded by a current conducting diaphragm of up to 10 mm. thickness in order to secure a uniform current density distribution and thereby a uniform layer thickness.

If the coatings are deposited by sparying, it is also preferably to produce several different metal layers. For example, the first layer may consist of molybdenum or nickel in a thickness of about 50 microns. The second coating is then preferably produced of copper and given a thickness of up to 1 mm. Suitable for this method is a spray gun, using the metal to be sprayed in pulverulent form with the grain size of about 100 microns. Particularly well applicable is a spray gun that produces a plasma beam. When producing the coatings by spraying, it is advisable to extend the insulating layers that separate the thermocouple legs in the upward direction so that they protrude beyond the end faces of the legs by a distance about equal to the thickness of the coating.

As mentioned, the space between the adjacent legs is filled by an insulating material of low heat conductance. Suitable for this purpose, for example, are organic adhesives or glass in compact or porous condition, as well as foils of organic material such as paper, or inorganic material such as asbestos. The thickness of the insulating layer between the legs should be kept less than 0.5 mm., preferably less than 0.1 mm. It is preferable to fasten the legs together with the insulating material by means of an adhesive, in which case the adhesive itself may constitute the insulating layer that separates the thermocouple legs.

The thermoelectric device, shown in FIG. 14 by a bottom view and in FIG. 15 by a top view, is composed of 62 thermocouple legs, namely, 31 p-type and 31 n-type legs which are all electrically connected in series and provided with two current supply terminals T. In each of FIGS. 14 and 15 the end faces of two adjacent legs B and B' are indicated by broken lines, these two end faces being electrically interconnected by a bridge portion (*c* in FIG. 16) and both covered by one of the reinforcing coatings F.

The particular thermoelectric materials used for the legs are not essential to the invention proper. Aside from the Bi and Te compositions mentioned elsewhere in this specification, other substance available for thermocouple purposes are also applicable, for example those described in the copending applications of E. Justi et al., Ser. No. 195,441, filed May 17, 1962, and now abandoned; J. Rupprecht, Ser. No. 212,411, filed July 25, 1962, now Patent No. 3,211,656; and H. Fleischmann, Ser. No. 212,412, filed July 25, 1962, now Patent No. 3,211,655, all assigned to the assignee of the present invention. In the embodiments according to FIGS. 2 to 12 the legs have approximately cubic shape and both legs (p-type and n-type) have the same or substantially the same cross section. However, as apparent from FIG. 13, the cross sections of the respective p-type and n-type legs may be different. This is of advantage particularly in cases where the electric conductivity values of the respective two leg materials are greatly different from each other. In this case the dimensionings are preferably so chosen that both legs have the same resistance, for example so that the respective cross sections essentially constitute different rectangles, or one leg is rectangular and the other square. However, other cross-sectional shapes are also applicable such as a parallelogram (diamond) or triangular shape.

The following example relates to a thermoelectric device for cooling purposes utilizing the Peltier effect by means of a design and manufacture as described above with reference to FIGS. 2 and 14 to 17. It will be understood that the following description of specific materials and particular dimensions is by way of example only and may be modified in accordance with the particular requirements or desiderata of the intended purpose.

A thermoelectric plate structure for cooling purposes is composed of 31 p-type legs and 31 n-type legs each having cubic shape of 5 x 5 x 5 mm. size (with the exception of the protruding bridge portion *c*). The p-type material consists of an alloy of 30 mole percent $Bi_2Te_3$ and 70 mole percent $Sb_2Te_3$, with a doping addition of 3% (by weight) of Te and 0.075% of Pb. The n-type alloy is composed of 80 mole percent $Bi_2Te_3$, 20 mole percent $Bi_2Se_3$ and a doping addition of 0.075% by weight of CuBr. Both alloys are produced from respective components of 99.99% purity by melting in an evacuated, fused-off cube of quartz.

Figure 17:
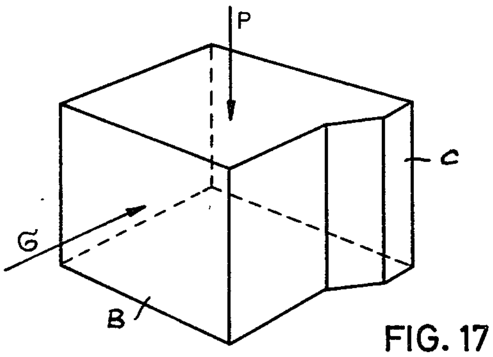
FIG. 17 illustrates in perspective a single leg of such a device made by pressing and sintering, and indicates the pressing and current-flow directions.

The p-alloy is then comminuted and screened to separate the grain sizes smaller than 0.5 mm. The n-type alloy is pulverized and the grain sizes of 0.06 and 0.5 mm. are screened off. The screen-off powders are pressed in respective steel dies under a pressure of 4 t. per cm.$^2$ (t.=metric ton) so that the protruding portions *c* of the leg is located along the pressing direction P (FIG. 17). After the legs are subsequently assembled to form the cooling plate, the current-flow direction $\sigma$ extends perpendicularly to the pressing direction P, also as indicated in FIG. 17. The pressing height is to 5 mm.

After press-molding the legs (and prior to the just-mentioned assembling), the shaped leg bodies of p-type material are sintered in pure hydrogen for 5 hours at 380° C. The press-molded n-type bodies are sintered for 2 hours in pure hydrogen, also at 380° C.

The properties of legs made in the above-described manner were measured as follows: Thermoforce of the n-type leg $\alpha=-160$ $\mu$v./degree, electric conductivity $\sigma=1050\Omega^{-1}$ cm.$^{-1}$, thermoforce of the p-type leg $\alpha=+180$ $\mu$v./degree, electric conductivity $$\sigma=1100\Omega^{-1}\text{ cm.}^{-1}$$

The legs thus produced are placed into a frame or jig so that p-type and n-type legs follow each other and are electrically all connected in series by the totality of the respective bridge portions *c*. Thereafter the interspaces between the legs are filled by casting resinous insulating material into these spaces. Suitable for this purpose is the material available in commerce under the trade name Araldit. After thus filling the spaces, the resin is hardened. In the case of Araldit this is done by heating the assembly at 180° C. for 2 hours. For cementing the legs together, there may also be used a pore-forming, hardenable synthetic plastic of low heat conductance. After hardening of the synthetic material, the plate is taken out of the frame or jig. If necessary or desirable, the top and bottom surfaces can then be ground to planar shape. However, due to the high accuracy of the legs produced by sintering, such grinding is generally not necessary. The surfaces of the plate are thereafter cleaned, before respective nickel coatings of 3 to 5 micron thickness are electrolytically deposited upon the leg faces and across the bridging contact localities. Thereafter a copper layer of 200 micron thickness is electrically deposited upon the nickel layer.

The total resistance of a cooling system produced in the above-described manner was measured as amounting to 110 mohm, corresponding to a value of 3.54 mohm for a single thermocouple comprising a p-type leg and an n-type leg with a total of four contact faces inclusive of the connecting bridge between the p-type and n-type legs.

In contrast thereto a value of 3.9 mohm per thermocouple was measured with a system of otherwise equal design but equipped with bismuth-coated legs and copper bridges of 1.5 mm. soldered to the bismuth coatings.

Cooling tests with the device made according to the invention in the above-described manner resulted at 16 A. in a temperature difference of 50° C., the hot side possessing a temperature of 40° C. This exceeds the temperature difference heretofore obtained with cooling blocks made by the other, less favorable methods.

The thermoelectric device described above can be employed as a cooling plate by applying a direct voltage to the two current supply terminals. By providing a temperature sensor and a conventional control circuit which affects polarity reversal of the current, a desired value of temperature can be accurately regulated with the aid of such a cooling plate. In this case, the thermoelectric device operates as a thermostat. If different temperatures act upon the two contact surfaces of the device, then a thermoelectric voltage is generated between the two connecting terminals, and the thermoelectric current will then pass through a load connected to the terminals. In this manner, the thermoelectric device is applicable as a current generator or energy converter.

We claim:

1. A thermoelectric device comprising a multiplicity of thermocouple leg pairs, each of said legs in each thermocouple pair being formed of semiconductive material and having a parallelogram-shaped cross-section of the same shape and size as that of the corresponding leg in each other pair, and all of said legs having the same height and being arranged in a rectangular mosaic pattern with all legs spaced and insulated from each other but firmly joined together to jointly form a block having respective top and bottom surfaces substantially coincident with respective two end faces of each leg; at least one of each two adjacent legs having a main body and a bridge portion integral with said body, said bridge portion protruding laterally from said body and contacting the adjacent leg, said integral bridge portions in said block forming an electric series connection of said leg pairs, and metal coatings of high conductivity insulated from one another on said two block surfaces, each of said coatings covering only one of said respective bridge portions and the contiguous end faces of the two legs interconnected by said one bridge portion so as to reinforce the connection between said two legs, said coatings having a very small thickness compared to the surface area thereof.

2. In a thermoelectric device according to claim 1, one of said two adjacent legs having a recess in contact engagement with the protruding bridge portion of the other leg, said recess being located in the same block plane as said latter bridge portion.

3. In a thermoelectric device according to claim 1, one of said two adjacent legs having a swallow-tail recess, and said protruding bridge portion of the other leg having a tapering end in mated engagement with said recess.

4. In a thermoelectric device according to claim 1, said block containing insulating cement between said mutually spaced thermocouple legs for firmly joining them together, at least one of each two adjacent legs having bevelled shape at the leg edge facing the other leg in said respective end faces, so as to form a funnel-shaped inlet opening for the interspace between said adjacent legs.

5. In a thermoelectric device according to claim 1, said layer containing insulating cement between said mutually spaced thermocouple legs for firmly joining them together, and said main body of said leg having bevelled shape along an end-face edge parallel to said bridge portion so as to form a widened inlet opening for leg interspace.

6. In a thermoelectric device according to claim 1, one of said two adjacent legs having a recess in contact engagement with the protruding bridge portion of the other leg, said recess being located in the same block plane as said latter bridge portion.

References Cited

UNITED STATES PATENTS

| | | | |
|---|---|---|---|
| 394,090 | 12/1888 | Woodward | 136—4 |
| 483,782 | 10/1892 | Giraud | 136—4 |
| 1,506,962 | 9/1924 | Andrews | 136—4.2 |
| 2,280,137 | 4/1942 | Wiegand | 136—5.1 |
| 2,378,804 | 6/1945 | Sparrow et al. | 136—5 |
| 2,984,077 | 5/1961 | Gaskill | 62—3 |
| 2,990,439 | 6/1961 | Goldsmid et al. | 136—5 |
| 2,997,514 | 8/1961 | Roeder | 136—4.2 |

FOREIGN PATENTS

| | | |
|---|---|---|
| 3,845 | 3/1885 | Great Britain. |
| 1,076,210 | 2/1960 | Germany. |

OTHER REFERENCES

Edser, E., "Heat for Advanced Students," 1936, pp. 401–403.

WINSTON A. DOUGLAS, *Primary Examiner.*

ALLEN B. CURTIS, *Examiner.*

A. M. BEKELMAN, *Assistant Examiner.*